United States Patent
Majumdar et al.

(10) Patent No.: US 9,798,352 B1
(45) Date of Patent: Oct. 24, 2017

(54) CIRCUITS FOR AND METHODS OF IMPLEMENTING A DESIGN FOR TESTING AND DEBUGGING WITH DUAL-EDGE CLOCKING

(71) Applicant: Xilinx, Inc., San Jose, CA (US)

(72) Inventors: Amitava Majumdar, San Jose, CA (US); Balakrishna Jayadev, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/939,704

(22) Filed: Nov. 12, 2015

(51) Int. Cl.
*G01R 31/317* (2006.01)
*G01R 31/3185* (2006.01)
*G06F 1/10* (2006.01)

(52) U.S. Cl.
CPC ......... *G06F 1/10* (2013.01); *G01R 31/31704* (2013.01); *G01R 31/31705* (2013.01); *G01R 31/31726* (2013.01); *G01R 31/318536* (2013.01); *G01R 31/318583* (2013.01)

(58) Field of Classification Search
CPC ............ G01R 31/317; G01R 31/31704; G01R 31/31705; G01R 31/31725; G01R 31/31726; G01R 31/318533; G01R 31/318536; G01R 31/318583; G06F 1/10; G06F 1/12
USPC .................. 327/185, 199; 714/724, 726, 731
See application file for complete search history.

(56) References Cited

U.S. PATENT DOCUMENTS

| | | | | |
|---|---|---|---|---|
| 6,072,348 A | * | 6/2000 | New | .................. G06F 1/32 327/295 |
| 6,137,331 A | * | 10/2000 | Peset Llopis | .......... H03K 3/037 327/18 |
| 7,907,461 B1 | | 3/2011 | Nguyen et al. | |
| 2004/0041610 A1 | * | 3/2004 | Kundu | ........... G01R 31/318541 327/215 |
| 2011/0066904 A1 | * | 3/2011 | Lackey | .......... G01R 31/318594 714/726 |
| 2016/0169966 A1 | * | 6/2016 | Abshishek | ..... G01R 31/318552 714/727 |

* cited by examiner

*Primary Examiner* — William Hernandez
(74) *Attorney, Agent, or Firm* — John J. King

(57) ABSTRACT

A circuit for implementing a scan chain in an integrated circuit having a clock domain crossing is described. The circuit comprises a first dual-edge storage circuit configured to receive an input signal at a scan input and to receive a first clock signal in a first clock domain at a clock input; a storage element having a data input configured to receive an output of the first dual-edge storage circuit; a second dual-edge storage circuit configured to receive an output of the storage element at a scan input and to receive a second clock signal in a second clock domain at a clock input; and a pulse generator configured to provide, to a clock input of the storage element, a pulse signal having a pulse width selected to enable the second dual-edge storage element to store the output of the first dual-edge storage element.

20 Claims, 8 Drawing Sheets

CIRCUITS FOR AND METHODS OF IMPLEMENTING A DESIGN FOR TESTING AND DEBUGGING WITH DUAL-EDGE CLOCKING

TECHNICAL FIELD

The present invention relates generally to integrated circuit (IC) devices, and particularly to circuits for and methods of implementing a scan chain in an integrated circuit, implementing clock-stoppage, and enabling design for test and design for debug using registers having dual-edge clocking. The circuits and methods enable test and debug of circuits by ensuring timing-safety in clock domain crossing in scan chains using registers having dual-edge clocking and enable scan-based fault coverage of AC and DC faults. The circuits and methods also enable stopping a test clock at a desired logic level, and the transitioning from a clock stop mode to a scan-shift mode for silicon debug.

BACKGROUND

Dual-edge clocking is used in a variety of applications to take advantage of both the rising and falling edges of a clock signal. Dual-edge clocking can provide improved performance at lower power by enabling reduced clock speeds for an integrated circuit. However, many integrated circuits implement multiple clock signals, where data may pass from one clock domain to another. That is, data sent from one register that is configured to receive a first clock signal associated with a first clock domain may be received by a register that is configured to receive a second clock signal associated with a second clock domain, and therefore must cross the clock domain.

Registers implemented in an integrated circuit may be a part of a scan chain to enable testing of the integrated circuit. Because scan chains that cross clock-domains may have an excessive amount of clock skew at clock-domain cross-over points, testing of the integrated circuit may lead to particular problems when performing testing using a scan chain in an integrated circuit having dual-edge clocking associated with registers in different clock domains. The testing of a scan chain using dual-edge clocking may not only be incomplete, but may also lead to errors in the testing based upon indeterminate test values at certain points of the scan chain. More particularly, when implementing design for test and design for debug with dual-edge clocking, errors during testing may occur when a register of a dual-edge clocking circuit is not tested or an incorrect signal is applied during testing.

Accordingly, circuits and methods that implement a scan chain in an integrated circuit having a clock domain crossing and overcome the deficiencies of conventional circuits are beneficial.

SUMMARY

A circuit for implementing a scan chain in an integrated circuit having a clock domain crossing is described. The circuit comprises a first dual-edge storage circuit configured to receive an input signal at a scan input and to receive a first clock signal in a first clock domain at a clock input; a storage element having a data input configured to receive an output of the first dual-edge storage circuit; a second dual-edge storage circuit configured to receive an output of the storage element at a scan input and to receive a second clock signal at a clock input; and a pulse generator configured to provide, to a clock input of the storage element, a pulse signal having a pulse width selected to enable the second dual-edge storage circuit to store the output of the storage element.

Another circuit for enabling stoppage of a clock in an integrated circuit comprises a plurality of dual-edge storage circuits configured to enable a debugging of an integrated circuit; a clock state capture circuit configured to generate a predetermined clock state value in response to a clock stop signal; and a first selection circuit enabling a selection of a clock signal or the predetermined clock state value to be applied to the plurality of dual edge storage circuits to enable a desired clock state value to be applied to storage elements of the plurality of dual-edge storage circuits.

A method of implementing a scan chain in an integrated circuit having a clock domain crossing is also disclosed. The method comprises configuring a first dual-edge storage circuit to receive an input signal at a scan input; providing a first clock signal in a first clock domain to a clock input of the first dual-edge storage circuit; configuring a first input of a storage element to receive an output of the first dual-edge storage circuit; configuring a scan input of a second dual-edge storage circuit to receive an output of the storage element; providing a second clock signal in a second clock domain to a clock input of the second dual-edge storage element; and providing, to a clock input of the storage element, a pulse signal having a pulse width selected to enable the second dual-edge storage element to store the output of the first dual-edge storage element.

A separate scan clock may also be implemented to ensure that a clock for implementing the scan chain is started in the correct phase when shifting data out during debug testing. According to one implementation, an additional register may also be implemented between a dual-edge storage element and a lockup latch to prevent any loss of data during a debug testing.

Other features will be recognized from consideration of the Detailed Description and the Claims, which follow.

DETAILED DESCRIPTION

Figure 1:
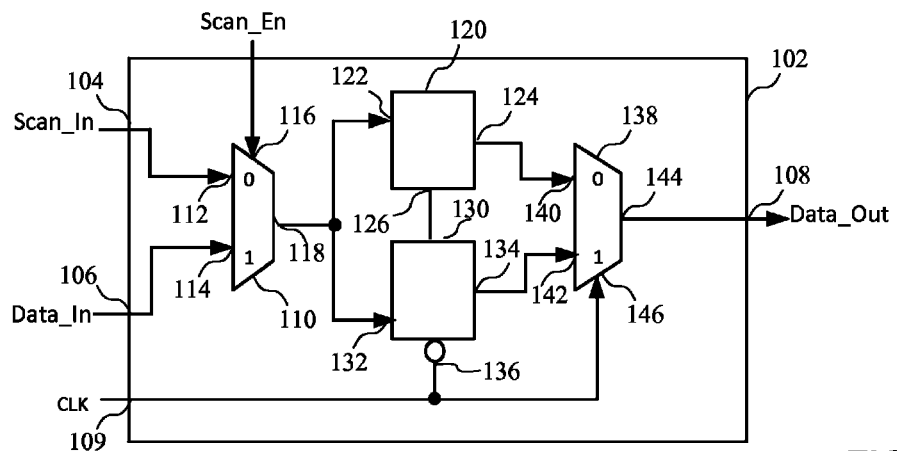
FIG. 1 is a block diagram of a dual-edge storage circuit.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The use of dual-edge clock logic enables implementing the same logic functions as with conventional single-edge clock logic, but with one or more clocks running at half the frequency needed for single-edge clock logic. Dual-edge clock logic saves dynamic power required in routing clock signals, which can be as high as 25-30% of total power consumed in integrated circuits. Dual-edge clock logic therefore offers a way to cut clock power by half. However, dual-edge clocking can create challenges when performing scan testing, including DC and AC testing, as well as when performing clock-stop and scan-shift for silicon debug. For example, when implementing a lockup latch with a dual-edge storage circuit in a first clock domain, the time period for storing data generated by the lockup latch in a second dual-edge storage circuit that is in a second clock domain may be too short to successfully latch the data. The circuits and methods set forth below ensure that a second dual-edge storage circuit coupled to an output of a lockup latch has sufficient time to store the data. The circuits and methods also enable independently stopping a clock in a given clock domain at either a high level or a low level to latch data by separate registers of the dual-edge storage circuits. The circuits and methods also enable starting scan-shift with a clock signal at a certain level, and accommodating a transition from a clock-stop to a scan-shift mode.

The circuits and methods set forth below enable implementing a lockup latch with dual-edge registers by controlling the lockup latch with a pulse generator, where the pulse generator may be configured to generate a minimum pulse width to provide improved timing. Further, clock control circuits may be implemented to ensure that the clock provided to the dual-edge register is stopped so that data stored in each register of the dual-edge register is checked during a debug process. A separate scan clock may also be implemented to ensure that a clock is started in the correct phase when resuming a scan operation during scan shift-mode for debug testing. An additional register may also be implemented between the dual-edge storage circuit and the lockup latch to prevent any loss of data during a debug process.

Turning first to FIG. 1, a block diagram of a dual-edge storage circuit 102, which may be used in scanning and debug operations for testing an integrated circuit as described below, is shown. In particular, the dual-edge storage circuit comprises a first input 104 coupled to receive a first input signal, which may be a scan input (Scan-In) signal. The dual-edge storage circuit 102 further comprises a second input 106 coupled to receive an input data (Data_In) signal, and generate an output data (Data_Out) signal at an output 108. A clock (CLK) signal is provided to a clock input 109. The output data may be a scan output during a scanning or debug operation, or data generated during a normal operation of the circuit. A selection circuit 110, shown here as a multiplexer, is coupled to select either the scan input signal received at the input 112 or the data input signal received at the input 114 in response to a control signal, shown here as a scan enable (Scan_En) signal, received at a control terminal 116. The selected signal of the two inputs is generated at an output 118.

A pair of storage elements coupled to receive the clock signal and an inverted clock signal at clock inputs, respectively, is also provided to enable the dual-edge operation of the dual-edge storage circuit 102. The inverted clock signal may be provided to a storage element by providing the clock signal to an inverted clock input of the storage element. A first storage element 120 comprises an input 122 coupled to the output 118 to receive the selected output signal generated by the selection circuit 110, and an output 124. The clock signal is received at a clock input 126 of the storage element 120. A second storage element 130 comprises an input 132 coupled to the output 118 to receive the selected output signal generated by the selection circuit 110, and an output 134. The clock signal is received at an inverted clock input 136 of the storage element 130 to enable the second storage element to be triggered on the inverted clock signal. Accordingly, the data selected by the selection circuit 110 will be latched on both the falling edge of the clock signal and the rising edge of the clock signal in the first storage element 120 and the second storage element 130, respectively.

A second selection circuit 138 comprises a first input 140 coupled to the output 124 of the first storage element 120 and a second input 142 coupled to the output 134 of the second storage element 130. The output data (Data_Out) signal is generated at the output 144 in response to the clock signal coupled to a selection input 146. Therefore, the dual-edge storage circuit 102 of FIG. 1 enables generating output signals at twice the clock rate by alternately selecting outputs of the storage element 120 and the storage element 130 on rising and falling edges of the clock signal, where the storage element 120 latches data on the falling edge of the clock signal and the storage element 130 latches data on the rising edge of the clock signal, for example. The storage elements 120 and 130 could be any type of edge-triggered register element, such as an edge-triggered latch or an edge-triggered flip-flop, for example. It should be noted that FIG. 1 is a functional depiction of a dual-edge storage circuit, and that other variations of dual-edge storage circuits can be implemented.

Figure 2:
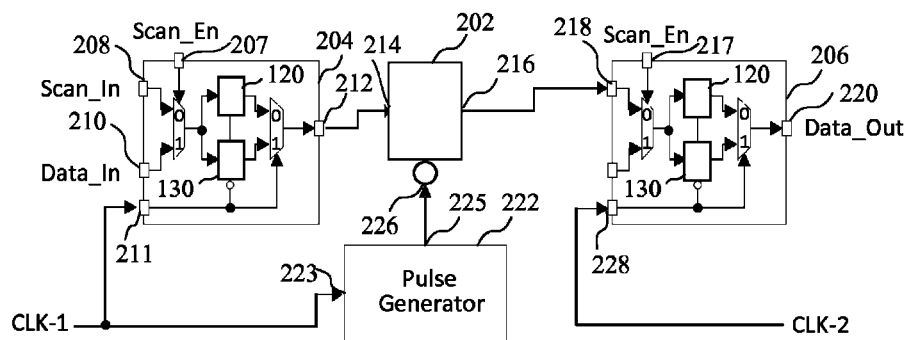
FIG. 2 is a block diagram of a circuit for implementing a scan chain having dual-edge storage circuits.

Turning now to FIG. 2, a block diagram of a circuit for implementing a scan chain having dual-edge storage circuits implemented in a scan chain configuration is shown. The circuit 200 of FIG. 2 comprises a storage element 202, which may be referred to a lockup latch, coupled between a first dual-edge storage circuit 204 and a second dual-edge storage circuit 206. The storage element 202 may be an edge-triggered latch, for example. While each of the dual-edge storage circuits 204 and 206 as shown are implemented according to the dual-edge storage circuit 102 described in FIG. 1, other dual-edge storage circuits could be implemented. The storage element 202 functions as a lockup latch, which accommodates any clock skew in the scan chain. The storage element 202 may be implemented where clock skew may be large and meeting hold timing may be difficult, such as when latching data using clock signals of two different clock domains.

The dual-edge storage circuit 204 comprises an input 207 that is coupled to receive a scan enable (Scan_En) signal, an input 208 coupled to receive a scan input (Scan_In) signal, an input 210 that is coupled to receive an input data (Data_In) signal, and an input 211 to receive a source clock, designated as CLK-1. In normal operation of the integrated circuit, the data signal is selected to be stored by the dual-edge storage circuit 204. However, during scan-based testing and debugging, the scan input signal is selected. Additional details related to the operation of a scan chain using the circuit 200 of FIG. 2 or the circuit 500 of FIG. 5 will be described in more detail in reference to FIGS. 17 and 18. An output 212 is coupled to the storage element 202 at an input 214. The second dual-edge storage circuit 206 is coupled to an output 216 of the storage element 202 at an input 218, where the scan enable signal is coupled to an input 217 and the output data (Data_Out) signal is generated at the output 220 in response to the sink clock signal (CLK-2) provided to the clock input 228.

A pulse generator 222 is coupled to receive the source clock (CLK-1) signal associated with a first clock domain at an input 223. An output 225 of the pulse generator is coupled to an inverted input 226 of the storage element 202. The pulse generator ensures that there is sufficient time to latch data generated by the first dual-edge storage circuit, as will be described in more detail in reference to the timing diagram of FIG. 3.

Figure 3:
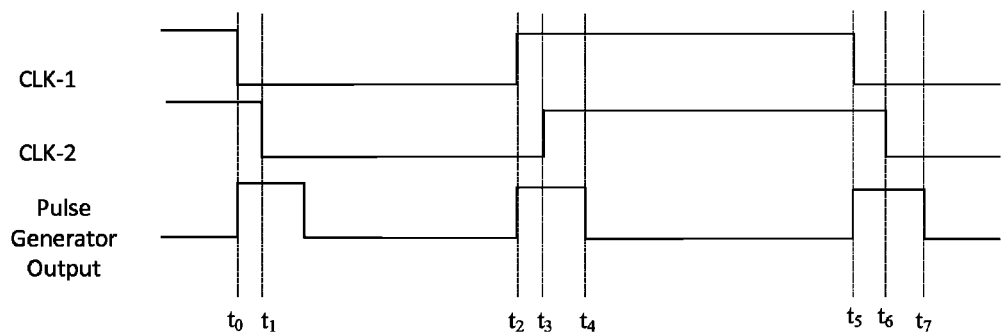
FIG. 3 is a timing diagram showing the operation of the dual-edge storage circuit of FIG. 2.

Turning now to FIG. 3, a timing diagram shows the operation of the dual-edge storage circuit of FIG. 2. There are no timing issues in a single clock edge arrangement having a lockup latch coupled to the output of a single clock register, such as the first storage element 120 of the source dual-edge storage circuit 204. The storage element 202 operating as a lockup latch with a pre-determined and fixed pulse-width is included to ensure that the data supplied in storage element 120 of the source dual-edge storage circuit 204 is available to be collected by the second storage element 130 in the sink dual-edge storage element 206. That is, the storage element 202 holds the data stored in the storage element 120 between time $t_2$ and $t_4$, the pre-determined pulse-width, to ensure that the correct data is latched by the storage element 130 of the sink dual-edge storage element 206 when sink CLK-2 goes high at time $t_3$.

However, timing issues may arise if the skew between Clk-1 and Clk-2 is large enough for the transition on Clk-2 to occur after time $t_4$, that is if $(t_3-t_2)>(t_4-t_2)$. If this occurs, data from dual-edge storage circuit 204 is lost. Due to this reason, the pulse-width has to be larger than the skew between clocks Clk-1 and Clk-2 and can be determined based on estimates of this skew. In a single clock edge arrangement where the storage element 202 implemented as a lockup latch is controlled by the CLK-1 signal, the storage element 202 is shut between times $t_2$ and $t_5$. Therefore, the time window between time $t_5$ and $t_6$ when the storage element 202 is open for enabling the latching of data from the storage element 130 of source dual-edge storage circuit 204 at the storage element 120 of the sink dual-edge storage circuit 206 may be too short to correctly latch the data. The pulse generator 222 is also implemented to ensure that the storage element 202 is open between the times $t_4$ and $t_5$ to provide a wider time window to receive the data in the storage element 120 of the sink dual-edge storage circuit 206, which is open after time $t_3$. Therefore, by implementing the pulse generator with a pre-determined pulse-width, where the pulse-width is programmable, it is possible to ensure that the data is transferred from one clock domain to another by ensuring that the storage element 202 is open long enough to enable the sink dual-edge storage element to store the data from the storage element 130 of the dual-edge storage element 204. As will be also further described below, that pulse width will be selected to ensure that the pulse width is wide enough to capture the falling edge of the second clock signal.

It should be noted that the pulse width generator can be implemented if the CLK-1 signal is late or early. If CLK-1 signal is early as shown in FIG. 3, the pulse width must be greater than the difference in arrival times between CLK-1 and CLK-2 (i.e. the time between $t_0$ and $t_1$). If CLK-2 is early, a pulse is not needed. However, if a pulse is generated, the 1-to-0 transition of the pulse should be sufficiently early relative to the next transition of CLK-2. This can be achieved by selecting a duty cycle and frequency of CLK-2, which could be controlled by a user.

Figure 4:
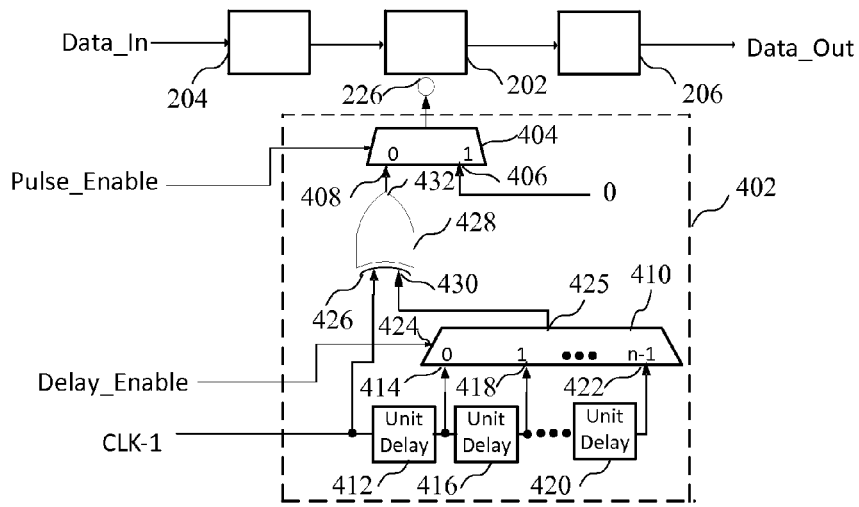
FIG. 4 is a block diagram showing a pulse generator that may be implemented in the circuit of FIG. 2.

However, if the storage element 202 and pulse-generator 222 have to be designed as a cell in a cell-library, the pulse-width has to be a programmable part of the pulse-generator cell 222, based on, for example, programmable delays. The actual programming of the pulse-width can be done either during design, based on estimates of clock-skew between source and sink clocks, CLK-1 and CLK-2, or based on characterization of silicon parts during actual usage of silicon. An example of a local pulse-generator standard cell is shown in FIG. 4.

A pulse generator 402 comprises a selection circuit 404, shown here as a multiplexer, coupled to receive a logical "0" at a first input 406 to enable the storage element to remain open, as described below. The selection circuit 404 also comprises an input 408 coupled to receive a signal based upon the clock signal CLK-1. A selection circuit 410 is coupled to a plurality a delay elements representing unit delays coupled to the clock signal. More particularly, a first delay element 412 is coupled to receive the clock signal and provides a first delayed clock signal to an input 414, and a second delay element 416 is coupled to receive the delayed clock signal and generate a second delayed clock signal at an input 418. Any number of delay elements could be coupled in series as shown, where an nth delay element 420 provides an nth delayed clock signal to an input 422 of the selection circuit 410. A delay enable (Delay_Enable) signal is coupled to a selection terminal 424 to enable a selected delayed clock signal generated at an output 425 of the selection circuit 410. The clock signal CLK-1 is provide to a first input 426 of an exclusive OR (XOR) gate 428 and the selected delayed clock signal generated at the output 425 of the selection circuit 410 is coupled to an input 430. The pulse is generated at an output 432 of the XOR gate 428.

It should be noted that the number of programmable unit delays used in a standard cell implementation is determined by the worst case skew between source and sink clocks. The larger this worst case skew, the more the number of unit-delays needed. Conversely, if the sink clock Clk-2 arrives earlier than the source clock Clk-1, then no pulse may be desired and the Pulse_Enable signal of FIG. 4 may be set to 1 to select a steady 0 value at the latch enable input (i.e. inverted input 226) in order to keep the latch open permanently. The delay, and hence the pulse-width, established by the delay enable (Delay_Enable) signal could be programmable through a memory cell or a JTAG user register, for example.

It should be clear that one advantage of the pulse-generator shown in FIG. 2 is that the timing to open and close the lock-up latch need only be synchronized to one clock, namely the source clock (CLK-1) in order to ensure reliable data transfer from the source dual-edge storage circuit 204 to the sink dual-edge storage circuit 206. However, a standard cell implementation of such a pulse-generator may have disadvantages, such as a minimum number of delay elements, a large multiplexer for programmability of delays, and as many storage cells, such as memory cells, to store the selection at the multiplexer's select inputs.

By implementing a pulse width generator having a pulse width that is large enough to account for the maximum difference in a delay between the source and sink clocks, the implementation of FIG. 3 may increase the test cost if the maximum difference in the delay is too large. That is, the scan-clock frequency is reduced with an increasing pulse width, where the scan clock frequency associated with all scan operations are reduced with the maximum pulse width. Therefore, a pulse generator can be selectively implemented when it is determined that the difference in arrival of the clock signals is sufficiently small that it may be difficult to latch data using the sink dual-edge storage element.

Figure 5:
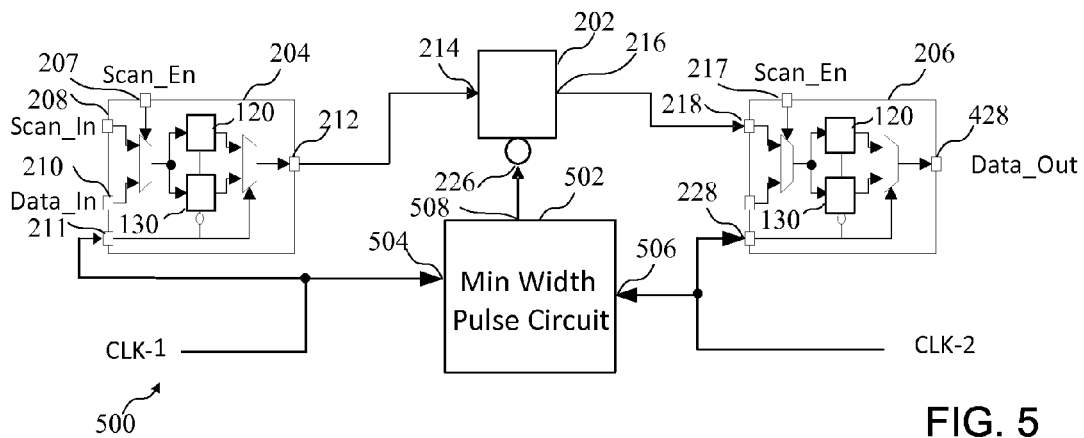
FIG. 5 is a block diagram of another circuit for implementing a scan chain having dual-edge storage circuits and a minimum pulse width circuit.

According to another implementation, the width of the pulse can be selected to avoid implementing a fixed pulse width to accommodate a range of possible differences in the clock domains. If the clock signals of the clock domains are relatively close, in which case the pulse width generated by the minimum pulse width circuit would be small, a minimum pulse width that may be greater than the pulse width generated by clock signals of the clock domains themselves can be generated. That is, because the pulse width may be based upon the clock signals of the first and second clock domains, the pulse width may be too small if the clock signals of the first and second clock domains are too close, and a pulse having a minimum pulse width may be necessary. According to the implementation of FIG. 5, a programmable circuit 500 implementing a scan chain having dual-edge storage circuits is provided, where a minimum pulse width circuit 502 is implemented. As shown in FIG. 5, the source clock signal CLK-1 is coupled to an input 504 of the minimum pulse width circuit 502, while the sink clock signal CLK-2 is coupled to the input 506 of the minimum pulse width circuit 502. As will be described in more detail below, the pulse generated at the output 508 is based upon both the CLK-1 signal and the CLK-2 signal.

Figure 6:
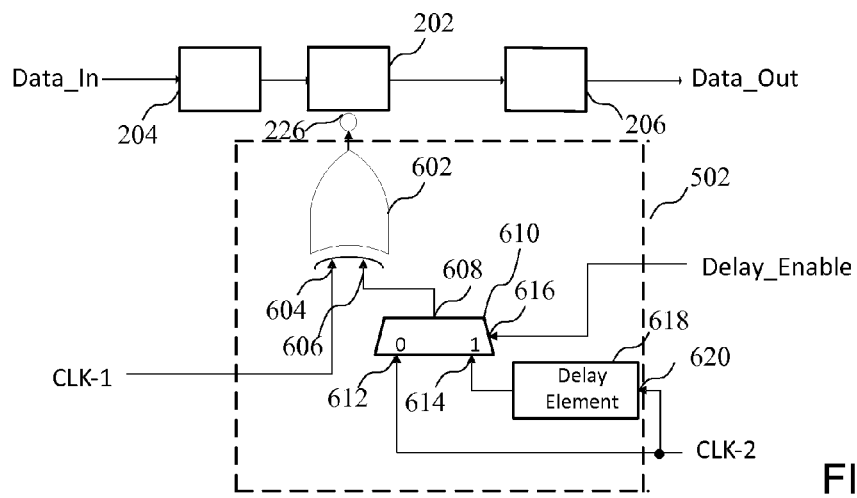
FIG. 6 is a block diagram showing the minimum pulse width circuit of the circuit for implementing a scan chain of FIG. 5.

An example of a minimum pulse width circuit that could be implemented as the minimum pulse width circuit 502 is shown in FIG. 6. The minimum pulse width circuit 502 comprises an exclusive OR (XOR) gate 602 that is coupled to receive a clock signal associated with a first source clock domain (e.g. CLK-1) at a first input 604. A clock signal associated with a second sink clock domain (e.g. CLK-2) is coupled to a second input 606, where the clock signal may be a delayed clock signal generated at an output 608 of selection circuit 610. The clock signal for the second clock domain coupled to a first input 612 or a delayed clock signal coupled to a second input 614 may be selected in response to a control signal comprising a delay enable (Delay_Enable) signal coupled to a control terminal 616. The delayed clock signal may be generated by delay element 618 that generates a fixed delay, coupled to receive the clock signal of the second clock domain at an input 620. The minimum pulse width could be selected by the delay element 618, for example, where the Delay_Enable signal could be generated by a clock control circuit monitoring the differences between the clock signals of the first and second clock domains. In general, for a standard cell implementation of the minimum pulse width circuit 502, the delay element may be a fixed delay. However, if the user desires different pulse-widths, depending on the usage scenario, the delay element may be a programmable delay element, such as delay element have user selectable taps to provide a desired delay. The delay could be programmable through a memory cell or a JTAG user register, for example.

Figure 7:
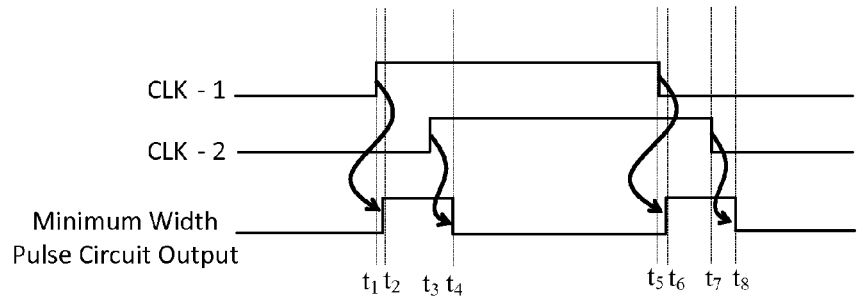
FIG. 7 is a timing diagram showing the operation of the dual-edge storage circuit of FIG. 5.
Figure 8:
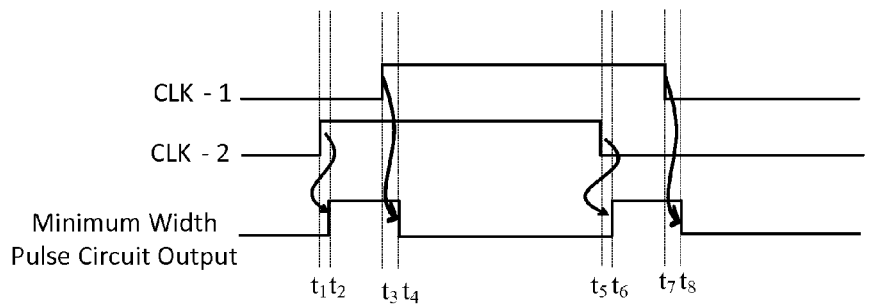
FIG. 8 is another timing diagram showing the operation of the dual-edge storage circuit of FIG. 5.

In operation, unlike a conventional lockup latch arrangement where the storage element 202 is closed during the period between $t_1$ and $t_5$ of FIG. 7, the storage element 202 of the circuit of FIG. 5 is closed during the periods between times $t_2$ and $t_4$ and times $t_6$ and $t_8$ as shown in FIG. 7, where CLK-2 lags behind CLK-1. The rising and falling edges of the CLK-1 and CLK-2 signals are used to generate the output pulse of the minimum pulse width circuit. Accordingly, the minimum width pulse circuit 502 overcomes the problem associated with an unknown required pulse width, and uses the clock signals of the different domains themselves to determine the width of the pulse. Because of the delay element shown in FIG. 6, the pulse width between times $t_6$ and $t_8$ can be greater than the period between times $t_5$ and $t_7$, ensuring that there is sufficient time to latch data using storage element 120 of the sink dual-edge storage circuit 206. If it is determined that CLK-1 and CLK-2 of the two clock domains are too close together, the output of the delay element can be selected so that the pulse width of the output of the minimum pulse width circuit is wide enough to store the data to be latched by storage element 120 of the sink dual-edge storage circuit 206. As shown in the examples of FIGS. 7 and 8, the minimum pulse width circuit enables the selection of a pulse width of the clock signal provided to the lockup latch to be wide enough to capture data on the storage element 120 of the dual-edge storage circuit 206. That is, the falling edge signal generated by the minimum width pulse circuit output generated at time $t_8$ can be based upon CLK-2 or a delayed version of CLK-2, where the delayed version of CLK-2 would be selected when CLK-1 is early relative to CLK-2, or when CLK-1 and CLK-2 are close enough that there might not be sufficient time to capture data on the storage element 120 of the dual-edge storage circuit 206.

Figure 9:
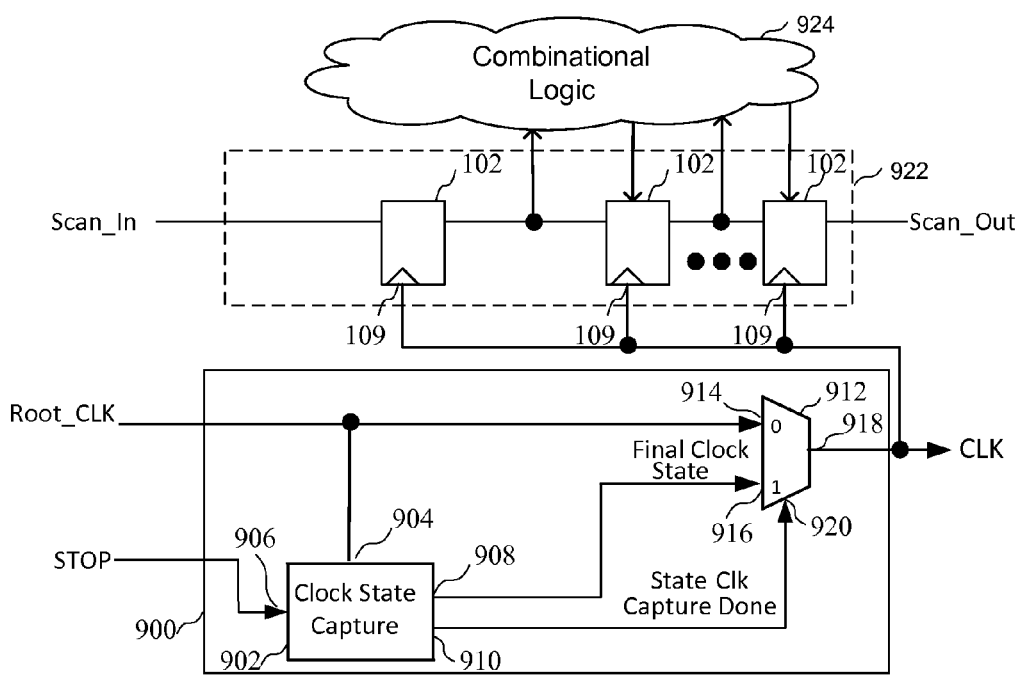
FIG. 9 is a block diagram showing a clock control circuit for enabling debug of a circuit.

As shown in FIG. 9, a block diagram of a clock control circuit 900 for enabling debug of a circuit is shown. The clock control circuit includes clock state capture circuit that represents a two-state clock stop circuit enabling the stopping of a clock associated with a clock domain when the clock signal is high (i.e. a logical "1") or low (i.e. a logical "0") during scan-dump based debug. Scan-dump based debug implements registers of a scan chain to shift data using a scan clock. Scan-dump based debug enables the circuit to run normal mission-mode operations, stop the clock at a pre-determined clock cycle while running mission mode operations, transition the storage elements from mission-mode to scan-shift mode and apply scan clocks to shift out the contents of the storage elements for post-processing and analyses. Therefore, each scan provides a way to observe the state of the machine in a clock cycle. Multiple iterations of this clock-stop process for different clock cycles enables capturing machine states across multiple clock cycles for failure and root-cause analyses.

As shown in the embodiment of FIG. 9, a clock generated in or coupled to an integrated circuit, shown here as a root clock (Root_CLK), is coupled to a clock state capture block 902 at a first input 904. A clock stop (STOP) signal, which is used to stop a clock signal provided to the dual-edge storage circuit at a predetermined high or low level, is also coupled to the clock state capture block 902 at a second input 906. Therefore, clock state capture circuit 902 enables stopping the clock at a predetermined time in order to generate an appropriate clock signal coupled to registers in a scan chain at an appropriate time. The clock state capture circuit 902 generates a desired clock value, designated here as a Final Clock State signal generated at an output 908, and generates a control signal, designated here as State Clock Capture Done signal, at an output 910. More particularly, the Root_Clk signal coupled to an input 914 or the Final Clock State signal coupled to the input 916 of a selection circuit 912, shown here as a multiplexer, is selected and generated at an output 918 in response to the State Clock Capture Done signal provided to a selection input 920. The State Clock Capture Done signal enables the selection of either the Root_Clk signal or the desired clock state to be generated as the clock (CLK) output of the selection circuit 912. The clock signal generated at the output 918 is coupled to clock inputs 109 of dual-clock edge storage circuits 102 implemented as a scan chain 922. Elements of the scan chain 922 are coupled to combinational logic 924, as will be described in more detail in reference to FIGS. 17 and 18. Therefore, the selection circuit 912 enables disconnecting a running clock, and stopping the clock coupled to the registers at a particular state.

Figure 10:
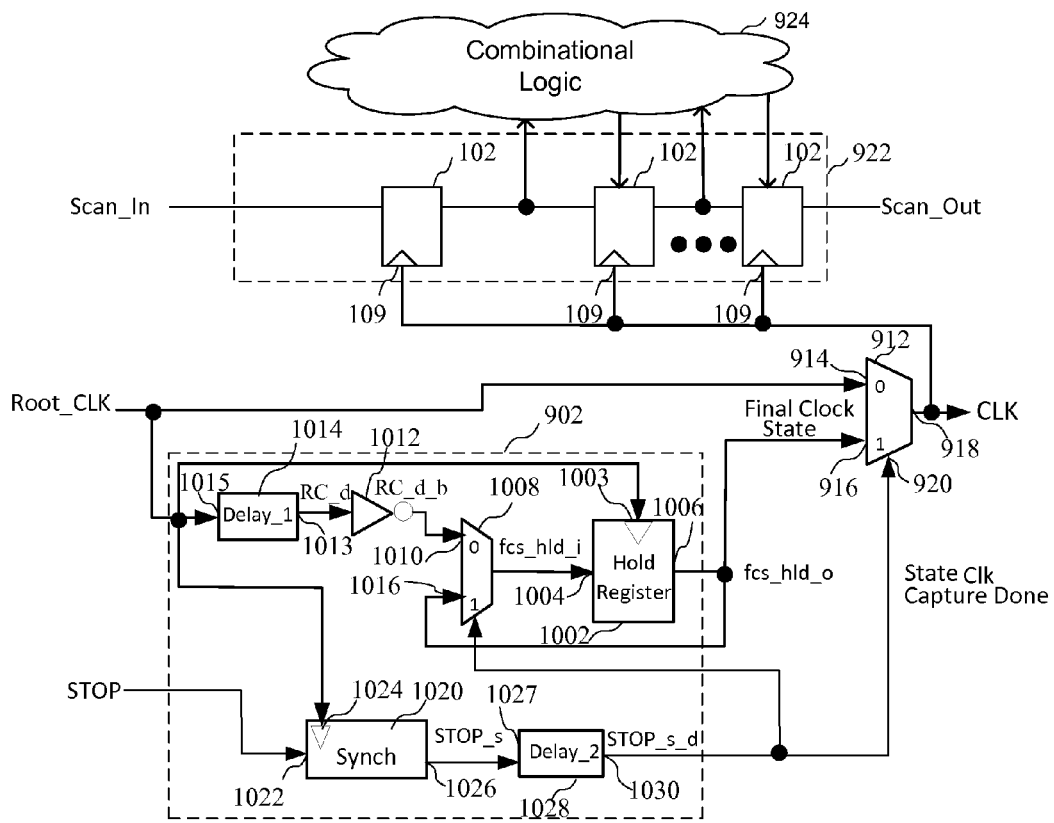
FIG. 10 is a block diagram showing the clock state capture circuit 902 of the clock control circuit of FIG. 9.

An example of a circuit for implementing a clock state capture circuit 902 is shown in FIG. 10. In particular, a hold register 1002 enables the selection of a state of the clock signal, and receives the Root_CLK signal at an input 1003. A delayed Root_CLK signal or a held clock signal is coupled at an input 1004 of the hold register 1002 and generates a final clock state hold (fcs_hld_o) value representing a Final Clock State signal at an output 1006. A selection circuit 1008 is coupled to receive the delayed version of the root clock signal at a first input 1010 by way of a first path comprising an inverter 1012 that generates an inverted delayed root clock (RC_d_b) signal. The RC_d_b signal at the output of the inverter 1012 is based upon a delayed root clock signal (RC_d), which is generated at an output 1013 of a delay element 1014 that receives the Root_CLK at an input 1015.

The State Clock Capture Done signal that is used to select the Final Clock State signal selected by the selection circuit 1008 and the CLK signal selected by the selection circuit 912 are based upon the STOP signal coupled to a synchronization circuit 1020 at an input 1022 and the Root_CLK signal coupled to a clock input 1024. The synchronization circuit 1020 enables the stop signal that is used to select the Final Clock State coupled to the selection circuit 912 to be in the clock domain of the circuit of FIG. 10, which is the Root_CLK clock domain. A clock stop (STOP_s) signal generated at an output 1026 of the synchronization circuit 1020 is coupled to an input 1027 of a second delay element 1028, where a delayed clock stop (STOP_s_d) signal is generated at an output 1030. The delayed clock stop signal is used to select the inverted delayed Root_CLK signal (RC_d_b) coupled to the input 1010 or a feedback signal coupled to input 1016. By feeding back the final clock state hold (fcs_hld_o) value of the hold register 1002, the state of the clock signal is preserved after the selection by the STOP_s_d signal is asserted.

The clock state capture circuit 902 requires two asynchronous delay elements, including the delay element 1014 and the delay element 1028. The delay element 1014 is provided to ensure that the correct clock value of the Root_CLK is captured by the hold register 1002. The delay element 1028 is provided to avoid a glitch on the clock and to make sure that the data that is fed to the hold register 1002 is stable before selecting an input to the selection circuit 1008. The delay elements 1014 and 1028 are preferably selected to have delays that are less than the clock period of the Root_CLK, but greater than the clock-to-output period of the hold register 1002.

Figure 11:
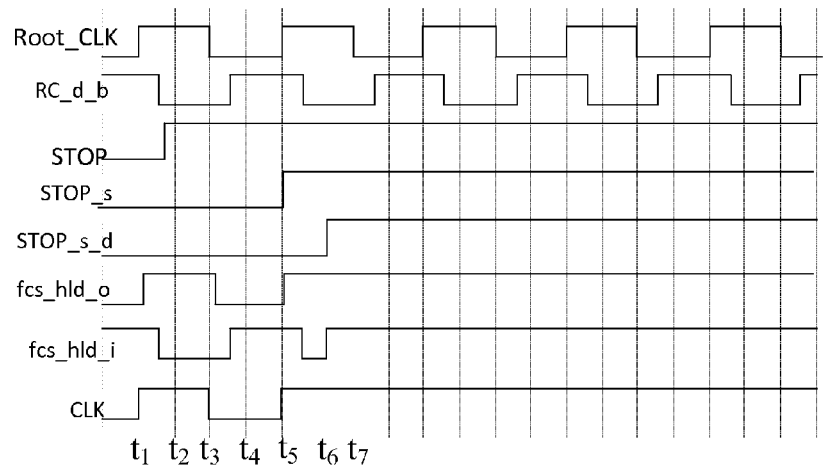
FIG. 11 is a timing diagram showing the operation of the clock control circuit of FIG. 10.
Figure 12:
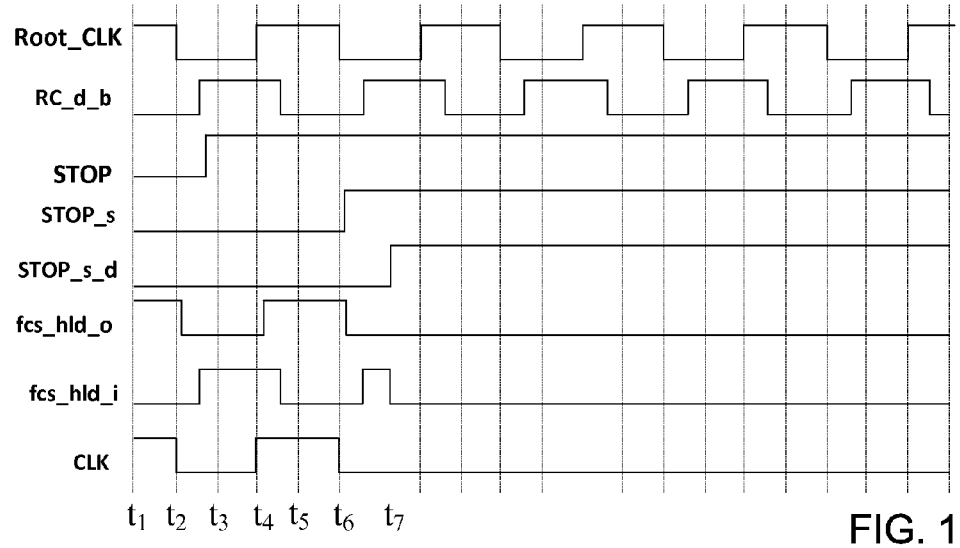
FIG. 12 is another timing diagram showing the operation of the clock control circuit of FIG. 10.

The timing diagrams of FIGS. 11 and 12 show the application of the STOP signal at different phases of then Root_CLK signal, where the STOP signal is pulled high when the Root_CLK signal is high in FIG. 11, and the STOP signal is pulled high when the Root_CLK signal is low in FIG. 12. As shown in FIG. 11, when the STOP_s_d signal is generated at time $t_6$, the rising edge of the STOP_s_d signal enables the fsc_hld_i value to be the held fsc_hld_o value, and the CLK output to be held high as a Final Clock State signal. As shown in the timing diagram of FIG. 12, because the STOP signal is generated when the Root_CLK signal is low, the fsc_hold_o signal is low when the Stop_s_d signal is pulled high, pulling the fcs_hld_i signal low at time $t_7$. The Final Clock State and therefore the CLK signal is therefore held low.

Figure 13:
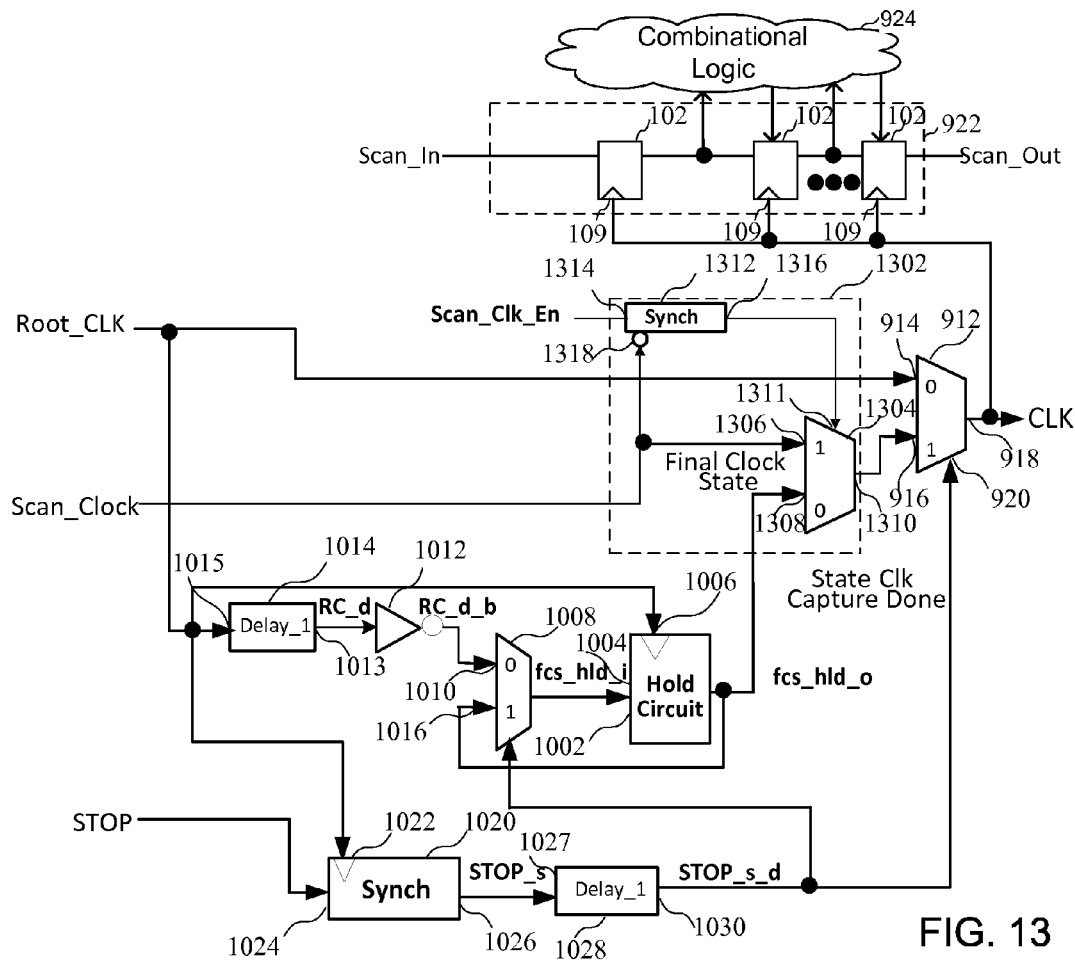
FIG. 13 is another block diagram of a clock control circuit enabling the insertion of a scan clock.

Turning now to FIG. 13, a block diagram of a clock control circuit enabling the insertion of a scan clock is shown. In particular, a clock insertion circuit 1302 enables inserting a scan clock to insure that the CLK signal generated at the output of the selection circuit 912 starts in the correct phase when transitioning from a clock stop mode to a scan-shift mode. The clock insertion circuit 1302 comprises a selection circuit 1304 coupled to receive a scan clock (Scan_Clock) signal at a first input 1306 and the Final Clock State signal generated at the output of the hold register 1002 at a second input 1308. The Scan_Clock signal or the Final State Clock signal is generated at an output 1310 in response to a selection signal at a selection terminal 1311. The selection signal is generated by a synchronization circuit 1312. The synchronization circuit 1312 receives a scan clock enable (Scan_Clk_En) signal that enables the use of the scan clock during a scan function. The Scan_Clk_En signal is coupled to an input 1314, where the selected signal coupled to the selection terminal 1311 of the selection circuit 1304 is generated at an output 1316 in response to the Scan_Clock signal coupled to an inverted clock input 1318 of the synchronization circuit 1312. The synchronization circuit 1312 ensures that the control signal coupled to the selection input changes state from low (0) to high (1) in a way that avoids glitches at the output of the selection circuit 1304 and the selection circuit 912 when transitioning from a clock stop mode to a scan shift mode. The scan clock may be a selected phase of the Root_CLK signal, for example.

Figure 14:
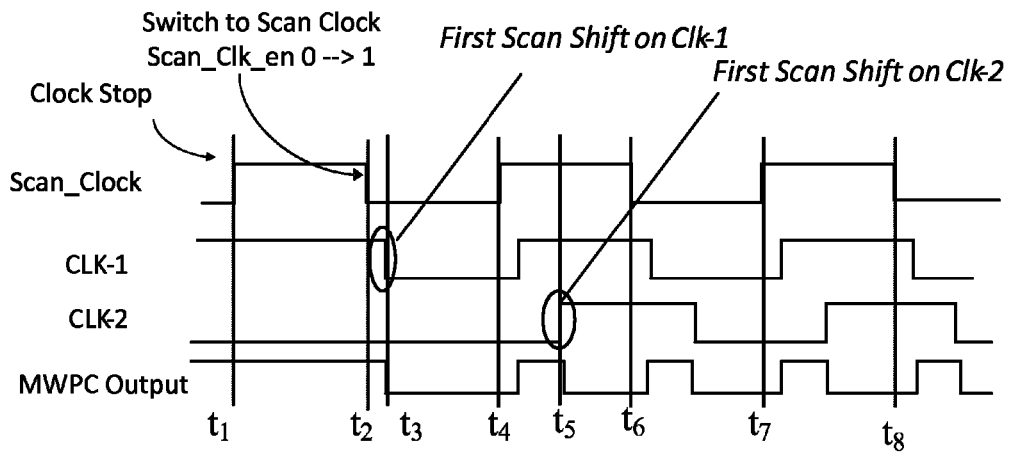
FIG. 14 is a timing diagram showing the operation of the circuit of FIG. 13.

As shown in the timing diagram of FIG. 14, after the clock stop (STOP) signal is received at the time $t_1$, the scan clock is then selected by the transition of the Scan_Clk_En signal from 0 to 1. With an initial value of 0, the scan clock transitions low at a time $t_2$, and the CLK-1 signal transitions from high to low at a time $t_3$, causing the output of the minimum pulse width circuit to also transition from 1 to 0. The first scan shift on CLK-2 occurs at a time $t_5$ on the rising edge of CLK-2. Accordingly, the scan clock can be used to ensure that the clock used to drive the scan chain starts at the correct value of either 0 or 1 at a predetermined time.

Figure 15:
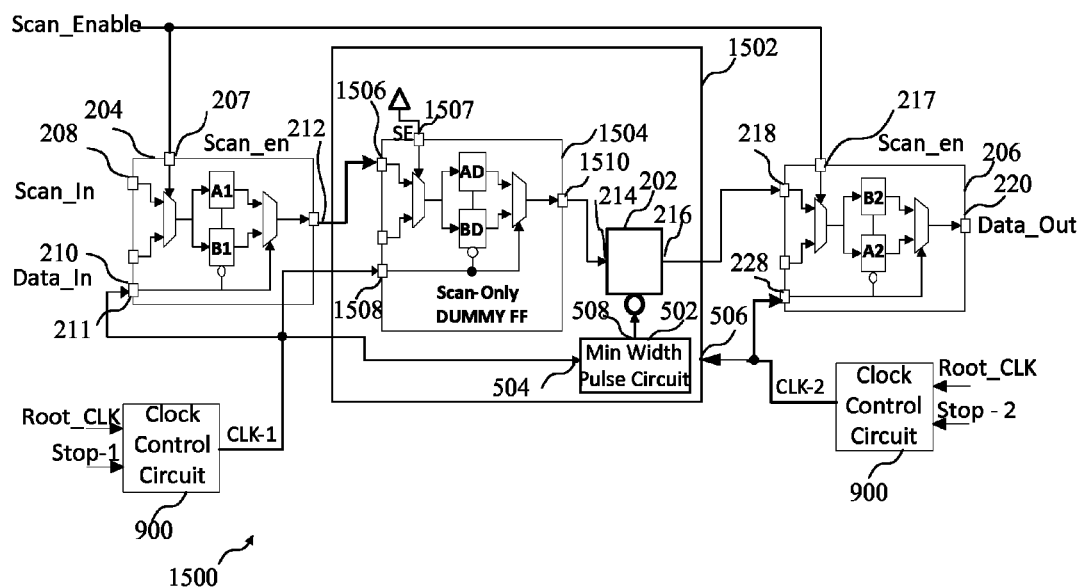
FIG. 15 is a block diagram of a circuit for implementing a scan chain having dual-edge storage circuits and a dummy register.

However, it is possible that data may be lost with a first scan of data of the storage element 130 of the dual-edge storage circuit 204 because the storage element 202 was closed. Accordingly, a circuit 1500 for implementing a scan chain having dual-edge storage circuits includes dual-edge lockup latch circuit 1502 having an additional register 1504, also known as a dummy register, as shown in FIG. 15. That is, an additional register is provided to ensure that the last value generated by the dual-edge storage circuit 202 is not lost when shifting to the scan clock, but rather is stored in an additional register 1504. In particular, the additional register 1504, which may be another dual-edge storage circuit as shown and described in FIG. 2, comprises a first input 1506 coupled to the output 212 of the dual-edge storage circuit 204. The select enable (SE) signal at the input 1507 is pulled low to always select the input coupled to the first input 1506. The CLK-1 signal is coupled to a clock input 1508, and dummy registers AD and BD of the additional register 1504 are used to selectively store the output of the dual-edge storage circuit 204. An output 1510 is coupled to the input 214 of the storage element 202. By implementing the additional register 1504, the data in storage element 130 of the dual-edge storage circuit 204 generated between time $t_1$ and $t_2$ of FIG. 13 will not be lost before switching to the scan clock by changing the Scan_Clk_En signal from 0 to 1 at time $t_2$.

Figure 16:
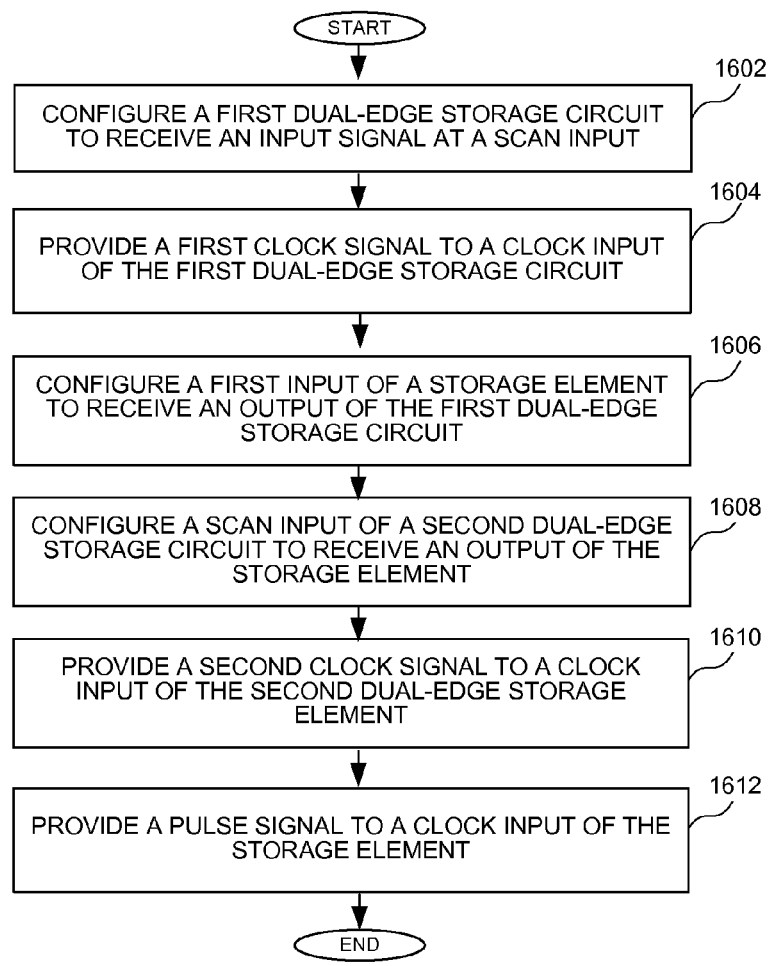
FIG. 16 is a flow chart showing a method of implementing a scan chain in an integrated circuit having a clock domain crossing.

Turning now to FIG. 16, a flow chart shows a method of implementing a scan chain in an integrated circuit having a clock domain crossing. In particular, a first dual-edge storage circuit is configured to receive an input signal at a scan input at a block 1602. A first clock signal is provided to a clock input of the first dual-edge storage circuit at a block 1604. The first dual-edge storage circuit could be dual-edge storage circuit 204 for example. A first input of a storage element is configured to receive an output of the first dual-edge storage circuit at a block 1606. The storage element could be storage element 202 for example. A scan input of a second dual-edge storage circuit is configured to receive an output of the storage element at a block 1608. The second dual-edge storage circuit could be dual-edge storage circuit 206 for example. A second clock signal is provided to a clock input of the second dual-edge storage element at a block 1610. A pulse signal is provided to a clock input of the storage element at a block 1612. The pulse signal could be applied as described above in reference to FIGS. 2-8 for example. While specific references may be made to FIG. 15, it should be understood that the elements of the method could be performed as described in another figure.

In implementing the pulse generator according to the implementation of FIG. 15, a selection circuit of the pulse generator may be configured to receive a delay enable signal at a control terminal of the selection circuit, where the delay enable signal enables controlling a pulse width of the pulse signal generated by the pulse generator. The delay may be generated according to the circuit of FIG. 6, for example, or some other suitable circuit. The second clock signal at a first input of a selection circuit of the pulse generator or a delayed second clock signal at a second input of the selection circuit may be selected.

A first clock control circuit may be configured to generate the first clock signal, where the first clock control circuit selects a clock edge of the first clock signal during a clock stop mode. A second clock control circuit may be configured to generate the second clock signal, where the second clock control circuit selects a clock edge of the second clock signal during the clock stop mode. The first and second clock control circuits could be implemented according to the circuits of FIGS. 9-13, for example, or some other suitable clock control circuit. The selection of a scan clock signal to enable scan clock insertion may also be implemented. An example of a circuit enabling scan clock insertion is described in reference to FIG. 13. A register of the first dual-edge storage circuit may also be coupled to an additional register of the storage element to prevent the loss of data as a result of scan clock insertion. The implementation of an additional register is described in reference to FIG. 15.

Figure 17:
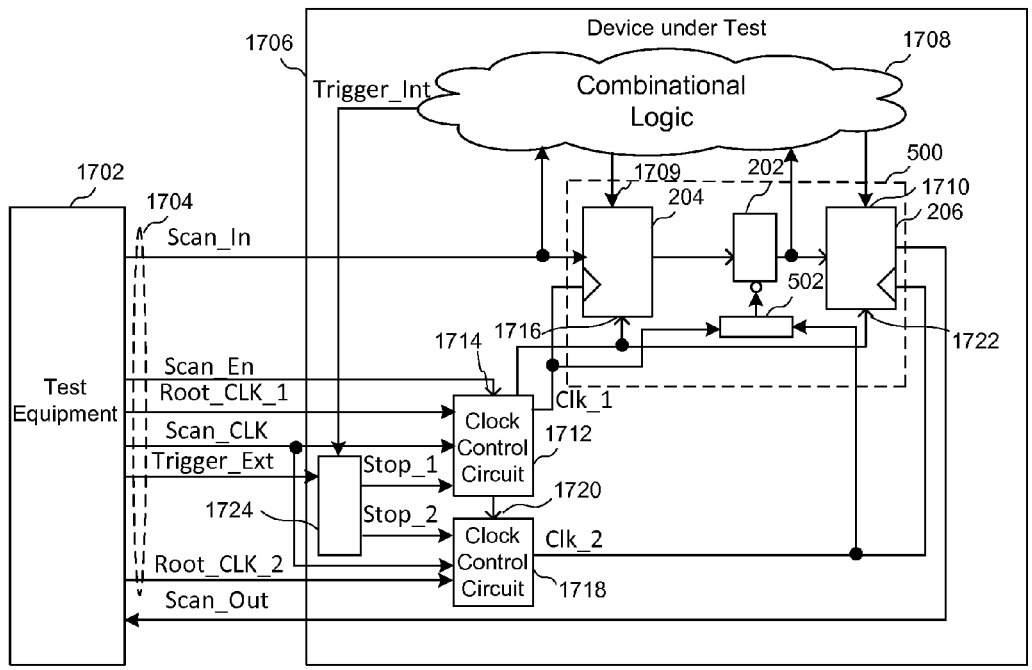
FIG. 17 is a block diagram showing test equipment enabling the testing of a device under test.

Turning now to FIG. 17, a block diagram of test equipment enabling the testing of a device under test is shown. In particular, test equipment 1702 generates a plurality of clock and data signals, including signals for enabling testing as described above, at a plurality of outputs 1704. The signals are coupled to a device under test (DUT) 1706 as shown. The DUT 1706 includes combinatorial logic 1708 coupled to the circuit 500 having dual-edge storage circuits of FIG. 5. A scan data input (Scan_In) signal is coupled to an input of the dual-edge storage circuit 204, while the CLK-1 signal of the first clock domain is provided to a clock input. The dual-edge storage circuit 204 receives an input from the combinatorial logic 1708 at an input 1709 and the dual-edge storage circuit receives an input from the combinatorial logic 1708 at an input 1710. The circuit 500 operates to enable the use of a scan chain by transmitting signals to dual-edge storage elements in different time domains, as described above. While the circuit 500 is shown in the device under test 1706 by way of example, it should be understood that the circuit 200 of FIG. 2 could also be implemented as described above. A scan enable (Scan_En) signal is coupled to a clock control circuit 1712 at an input 1714. The clock control circuit 1712 generates a separate scan enable signal that is coupled to the dual-edge storage circuit 204 at an input 1716. The scan enable signal is also coupled to a clock control circuit 1718 at an input 1720. The clock control circuit 1718 generates a separate scan enable signal that is coupled to the dual-edge storage circuit 206 at an input 1722. The clock control circuits 1712 and 1718 may be implemented as described in reference to FIG. 9. The Stop-1 and Stop-2 signals are coupled to the clock control circuit 1712 and the clock control circuit 1718 from a clock stop control circuit 1724 in response to either an internal trigger (Trigger_Int) from the combinational logic 1708 or an external trigger (Trigger_ext) from the test equipment 1702. A scan output is generated at an output of the dual-edge storage circuit 206.

The test equipment arrangement of FIG. 17 enables implementing both design for test, which stops to record a value, and design for debug, which shift out values after testing. These scan-based tests enable both DC testing and AC testing. During debugging, the clocks coupled to the dual-edge storage circuits are stopped at predetermined times to capture the state of the circuit at certain points. Those captured states must be shifted out of the scan chain. During test, the dual-edge storage circuits are configured as a shift register, and scan enable is asserted. The dual-edge storage circuits are no longer communicating with the combinational logic, but configured to shift in stimuli to the dual-edge storage circuits. Data from the combinatorial logic is then captured in the dual-edge storage circuits. Scan enable is then re-asserted to shift the values out during debugging. The circuit of FIG. 17 is provided by way of example, and it should be understood that the scan chain could be implemented in a variety of other ways.

Figure 18:
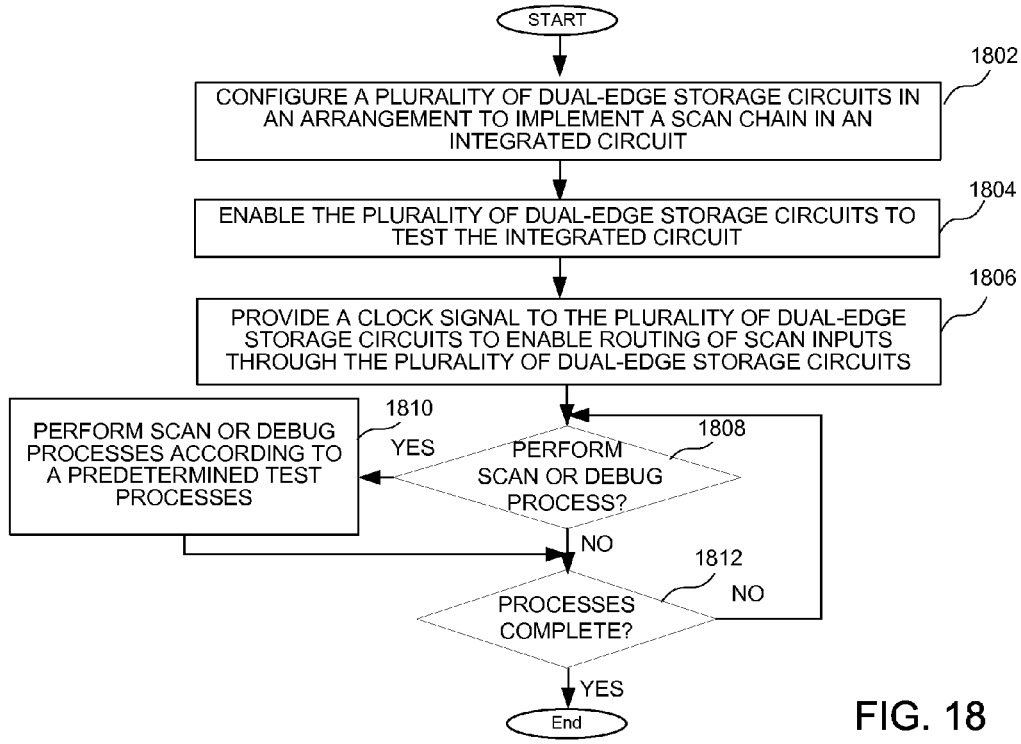
FIG. 18 is a flow chart showing the operation of the test equipment of FIG. 17.

Turning now to FIG. 18, a flow chart provides a method of implementing a scan chain, and shows the operation of the test equipment arrangement circuit of FIG. 17 to enable the scan and debugging of an integrated circuit. A plurality of dual-edge storage circuits is configured in an arrangement to implement a scan chain in an integrated circuit at a block 1802. The integrated circuit could be any type of integrated circuit, such as an application specific integrated circuit (ASIC) or a field programmable gate array (FPGA). The plurality of dual-edge storage circuits are enabled to test the integrated circuit at a block 1804. Clock signals are provided to the plurality of dual-edge storage circuits to enable the routing of data or scan inputs through the plurality of dual-edge storage circuits at a block 1806. It is then determined if scan or debug processes are to be performed at a block 1808. If so, scanning or debugging processes are performed according to a predetermined test processes at a block 1810. It is then determined whether the processes are complete at a block 1812. If not, the processes continue at the block 1808. Otherwise, testing is ended.

It can therefore be appreciated that new circuits for and methods of implementing a scan chain in an integrated circuit having a clock domain crossing and more particularly performing scanning and debugging of integrated circuits have been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. A circuit for implementing a scan chain in an integrated circuit having a clock domain crossing, the circuit comprising:
    a first dual-edge storage circuit configured to receive an input signal at a scan input and to receive a first clock signal in a first clock domain at a clock input;
    a storage element having a data input configured to receive an output of the first dual-edge storage circuit;
    a second dual-edge storage circuit configured to receive an output of the storage element at a scan input and to receive a second clock signal in a second clock domain at a clock input; and
    a pulse generator configured to provide, to a clock input of the storage element, a pulse signal having a pulse width selected to enable the second dual-edge storage circuit to store the output of the storage element.

2. The circuit of claim 1 wherein the first dual-edge storage circuit comprises a first storage element configured to receive the first clock signal and a second storage element configured to receive an inverted first clock signal, and the second dual-edge storage circuit comprises a third storage element configured to receive the second clock signal and a fourth storage element configured to receive an inverted second clock signal, wherein data stored in the first storage element of the first dual-edge storage circuit using the first clock signal is latched by the fourth storage element of the second dual-edge storage circuit using the inverted second clock signal, and data stored in the second storage element of the first dual-edge storage circuit using the inverted first clock signal is latched by the third storage element of the second dual-edge storage circuit using the second clock signal.

3. The circuit of claim 1 wherein the pulse generator is configured to generate the pulse signal having a minimum pulse width.

4. The circuit of claim 3 wherein the pulse generator comprises a selection circuit configured to receive the second clock signal at a first input and a delayed second clock signal at a second input, and wherein the selection circuit is configured to receive a delay enable signal at a control terminal of the selection circuit, the delay enable signal enabling controlling a pulse width of the pulse signal generated by the pulse generator.

5. The circuit of claim 1 further comprising a first clock control circuit configured to generate the first clock signal, the first clock control circuit enabling the selection of a clock edge of the first clock signal during a clock stop mode.

6. The circuit of claim 5 further comprising a clock insertion circuit having a selection circuit enabling the selection of a final clock state signal selected during the clock stop mode or a scan clock selected during a scan-shift mode.

7. The circuit of claim 6, further comprising a register coupled between the first dual-edge storage circuit and the storage element, wherein the register stores data to be used when transitioning from the clock stop mode to the scan-shift mode.

8. The circuit of claim 1, wherein the first dual-edge storage circuit and the second dual-edge storage circuit are configured to enable a debugging of the integrated circuit, the circuit further comprising:
    a clock state capture circuit configured to generate a predetermined clock state value in response to a clock stop signal; and
    a first selection circuit enabling a selection of a clock signal or the predetermined clock state value to be applied to the first dual-edge storage circuit to enable a desired clock state value to be applied to storage elements of the first dual-edge storage circuit.

9. The circuit of claim 8 wherein the clock state capture circuit comprises a hold register configured to receive a delayed clock signal or the predetermined clock state value.

10. The circuit of claim 9 further comprising a second selection circuit configured to receive the delayed clock signal and an output of the hold register.

11. The circuit of claim 10 further comprising a first delay element coupled to receive the clock signal and generate the delayed clock signal, wherein the first delay element enables the selection of a correct value of the clock signal to be stored by the hold register.

12. The circuit of claim 11 further comprising a second delay element configured to receive the clock stop signal, wherein the second delay element ensures that the predetermined clock state value provided to the hold register is stable.

13. The circuit of claim 12 wherein an output of the second delay element is configured to control the first selection circuit and the second selection circuit.

14. The circuit of claim 8 further comprising a third selection circuit enabling a selection of the predetermined clock state value or a scan clock signal, wherein the scan clock signal enables a predetermined level of the scan clock signal to be applied to the first dual-edge storage circuit after a clock stop mode.

15. A method of implementing a scan chain in an integrated circuit having a clock domain crossing, the method comprising:
    configuring a first dual-edge storage circuit to receive an input signal at a scan input;
    providing a first clock signal in a first clock domain to a clock input of the first dual-edge storage circuit;
    configuring a first input of a storage element to receive an output of the first dual-edge storage circuit;

configuring a scan input of a second dual-edge storage circuit to receive an output of the storage element;

providing a second clock signal in a second clock domain to a clock input of the second dual-edge storage element; and providing, to a clock input of the storage element, a pulse signal having a pulse width selected to enable the second dual-edge storage circuit to store the output of the storage element.

16. The method of claim 15 further comprising configuring a clock input of a first storage element of the first dual-edge storage circuit to receive the first clock signal and configuring a clock input of a second storage element of the first dual-edge storage circuit to receive an inverted first clock signal, and configuring a clock input of a third storage element of the second dual-edge storage circuit to receive the second clock signal and configuring a clock input of a fourth storage element of the second dual-edge storage circuit to receive an inverted second clock signal, wherein data stored in the first storage element of the first dual-edge storage circuit using the first clock signal is latched by the fourth storage element of the second dual-edge storage circuit using the inverted second clock signal, and data stored in the second storage element of the first dual-edge storage circuit using the inverted first clock signal is latched by the third storage element of the second dual-edge storage circuit using the second clock signal.

17. The method of claim 15 further comprising generating the pulse signal having a minimum pulse width.

18. The method of claim 17 further comprising selecting the second clock signal at a first input of a selection circuit of a pulse generator or a delayed second clock signal at a second input of the selection circuit.

19. The method of claim 18 further comprising configuring the selection circuit to receive a delay enable signal at a control terminal of the selection circuit of the pulse generator, the delay enable signal enabling controlling a pulse width of the pulse signal generated by the pulse generator.

20. The method of claim 15 further comprising configuring a first clock control circuit to generate the first clock signal, the first clock control circuit enabling a selection of a clock edge of the first clock signal during a clock stop mode.

* * * * *